United States Patent [19]

Sano

[11] 4,422,156
[45] Dec. 20, 1983

[54] DIGITAL FILTER DEVICE

[75] Inventor: Shigenori Sano, Higashi-Yamato, Japan

[73] Assignee: Casio Computer Co., Ltd., Tokyo, Japan

[21] Appl. No.: 256,187

[22] Filed: Apr. 21, 1981

[30] Foreign Application Priority Data

Apr. 22, 1980 [JP] Japan ................................ 55-53179
Apr. 22, 1980 [JP] Japan ................................ 55-53181
Apr. 22, 1980 [JP] Japan ................................ 55-53182

[51] Int. Cl.³ ............................................. G06F 15/34
[52] U.S. Cl. .................................................... 364/724
[58] Field of Search .................. 364/724, 825; 375/13, 375/14; 179/20 P

[56] References Cited

U.S. PATENT DOCUMENTS

| | | | |
|---|---|---|---|
| 3,852,531 | 12/1974 | Fretwell et al. ................ | 179/2 DP |
| 4,031,378 | 6/1977 | LeComte ........................... | 364/724 |
| 4,066,881 | 1/1978 | Houdard ........................... | 364/724 |
| 4,121,295 | 10/1978 | Witt .................................... | 364/724 |
| 4,157,457 | 6/1979 | Sakoe et al. ...................... | 364/724 |
| 4,158,232 | 6/1979 | Koeth et al. ...................... | 364/724 |
| 4,255,794 | 3/1981 | Nakayama ........................ | 364/724 |
| 4,305,133 | 12/1981 | Amada et al. .................... | 364/724 |

Primary Examiner—Gary Chin
Attorney, Agent, or Firm—Frishauf, Holtz, Goodman & Woodward

[57] ABSTRACT

Coefficients used for calculating a transfer function are read out from a ROM corresponding to the cutoff frequency of a desired filter. Using the coefficients read out from the ROM, other coefficients are calculated in a coefficient calculating circuit. The filtering operation is performed by a digital filter circuit, using the obtained coefficients together with the coefficients read out from the ROM.

10 Claims, 16 Drawing Figures

F I G. 11
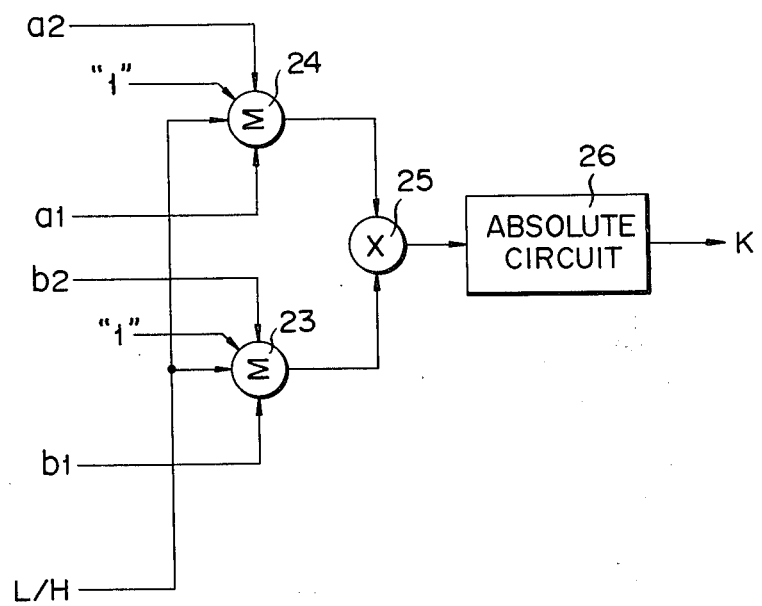
F I G. 12
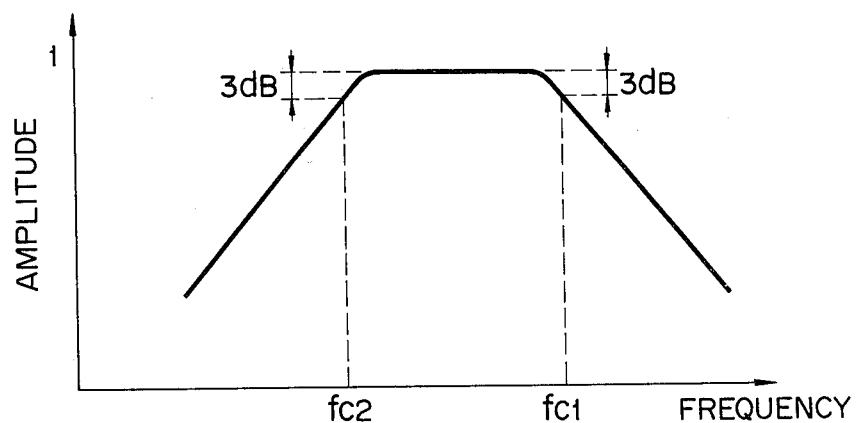

DIGITAL FILTER DEVICE

BACKGROUND OF THE INVENTION

The present invention relates to a digital filter device.

Low-pass filters, high-pass filters, band-pass filters and so on have conventionally been used as digital filters.

The first stage in designing the digital filter is to obtain its transfer function H(z). This transfer function H(z) may be obtained with respect to either the frequency or the time. Each of these methods may be further divided into FIR (finite impulse response type) according to which the handling of the impulse response of the digital filter is terminated at a finite limit, and IIR (infinite impulse response type) according to which this handling is continued indefinitely. The IIR type filter is further divided into several kinds according to design. Among them are filters which are designed to perform as analog filters, the transfer function H(S) of the analog filter is obtained, and this transfer function H(S) unergoes a transform such as the standard z-transform, the bilinear z-transform, or the alignment z-transform.

FIG. 1 shows an example of the frequency characteristic curve of an analog low-pass filter. This characteristic curve corresponds to the magnitude-squared response of a Butterworth filter. The method for performing the bilinear z-transform of H(S) of the analog filter of this type to obtain the transfer function H(z) may be described as follows. The poles of the Butterworth filter having the characteristic shown in FIG. 1 have conjugate roots such as P1 and P2 shown in FIG. 2. The analog transfer function H1(S) of this filter is given by $$H1(S) = 1/(S^2 + \sqrt{2}\, S + 1) \tag{1}$$

where S is the Laplace variable. Therefore, the transfer function of the low-pass filter with the cutoff frequency fc may be obtained as $$H(S) = \omega c^2/(S^2 + \sqrt{2}\, S\omega c + \omega c^2) \tag{2}$$

by replacing S in equation (1) with S/ωc (ωc=2πfc: angular frequency).

The transfer function H(z) of the digital filter may be obtained by performing the transform $$S = \frac{2}{T}\left(\frac{1 - z^{-1}}{1 + z^{-1}}\right) \tag{3}$$

for the variable S of the analog transfer function H(S). In equation (3), T is the sampling time and z is the variable of the bilinear z-transform. When equation (3) is substituted in equation (2), the transfer function H(z) may be given as $$H(z) = \tag{4}$$

$$\frac{\omega c^2}{\frac{4}{T^2}\left(\frac{1 - z^{-1}}{1 + z^{-1}}\right)^2 + \sqrt{2}\,\omega c \frac{2}{T}\left(\frac{1 - z^{-1}}{1 + z^{-1}}\right) + \omega c^2}$$

The frequency distortion in the S-z transform is considered here. When $z = e^{j\omega DT}$ is substituted in equation (3), we have the following equation $$\frac{\omega a T}{2} = \tan\frac{\omega DT}{2} \tag{5}$$

where ωa is the angular frequency in the S-plane and ωD is the angular frequency in the z-plane. It is seen from equation (5) that, with higher frequencies, increasing distortion is caused by the S-z transform. When ωa=ωc in equation (5), ωc is given as $$\omega c = \frac{2}{T} \tan\frac{\omega DT}{2} \tag{6}$$

When tan (ωDT/2)=A in equation (6), equation (4) may be rewritten as $$H(z) = \tag{7}$$

$$\frac{A^2(1 + z^{-1})^2}{(1 + \sqrt{2}\, A + A^2) + (2A^2 - 2)z^{-1} + (1 - \sqrt{2}\, A + A^2)z^{-2}}$$

Making the following simplifications, $$1 + \sqrt{2}\, A + A^2 = B$$

$$b1 = 2(A^2 - 1)/B$$

$$b2 = (1 - \sqrt{2}\, A + A^2)/B$$

$$K_L = A^2/B,$$

equation (7) may be rewritten as $$H(z) = \frac{K_L(1 + z^{-1})^2}{1 + b1z^{-1} + b2z^{-2}} \tag{8}$$

A digital circuit having the transfer function satisfying equation (8) will comprise a desired digital Butterworth filter.

FIG. 3 shows the construction of a digital filter device having a transfer function according to equation (8). In FIG. 3, an input signal is supplied to an adder 1. An output of the adder 1 is supplied to an adder 2 as well as to a delay element 3 with a delay time T. An output of the delay element 3 is supplied to input terminals of multipliers 4 and 5. A coefficient b1 of a ROM 6 is supplied to a multiplication coefficient input terminal of the multiplier 4. An output of the multiplier 4 is supplied to a negative input terminal of the adder 1. An output of the multiplier 5 is supplied to a positive input terminal of the adder 2. The output of the delay element 3 is further supplied to a delay element 7 of the delay time T whose output is supplied to a multiplier 8 and the adder 2. A coefficient b2 is supplied to the multiplier 8 from the ROM 6. An output of the multiplier 8 is supplied to another negative input terminal of the adder 1. A digital signal representing the cutoff frequency fc of the filter is supplied to the ROM 6. The ROM 6 is so constructed as to selectively output the coefficients b1, b2, and $K_L$ of various values of equation (8) in response to the input of fc according to its various values. An output of the adder 2 is supplied to a multiplier 9 together with the output $K_L$ of the ROM 6, and the multiplier 9 outputs an output signal of the filter. A low-pass filter having the transfer function H(z) as given by equation (8) is thus constructed as shown in FIG. 3.

In a digital filter device of such a construction, the values of the coefficients b1, b2 and $K_L$ in the ROM 6 selected by the cutoff frequency fc increase as the cutoff frequency fc increases. The storage capacity of the ROM 6 must correspondingly be made larger.

Although the description has been made with reference to a digital low-pass filter, the same applies to a high-pass filter or a band-pass filter. The transfer function of a band-pass filter is more complex than that of a low-pass filter or a high-pass filter, and the required storage capacity of the ROM for storing the coefficients is correspondingly larger.

The ROM occupies a relatively large area on the semiconductor chip when integrating a digital filter. Therefore, the larger area occupied by the ROM results in less area for other elements and wirings, adversely affecting the multi-functional property of the digital filter.

It is, therefore, an object of the present invention to provide a digital filter device according to which the storage capacity of a memory for storing coefficients may be minimized and a higher packaging density may be realized without degrading the function of the digital filter.

SUMMARY OF THE INVENTION

The above and other objects may be achieved by a digital filter device according to the present invention in which the storage capacity of a memory for storing coefficients may be minimized by calculating at least one coefficient for obtaining the transfer function.

This invention can be more fully understood from the following detailed description when taken in conjunction with the accompanying drawings.

BRIEF DESCRIPTION OF THE DRAWINGS

FIG. 11 shows another circuit diagram of the coefficient calculating circuit for calculating the coefficient K;

FIG. 12 shows a frequency characteristic curve of a band-pass filter;

DETAILED DESCRIPTION

The description will now be made of a case wherein the present invention is applied to a Butterworth digital low-pass filter. Table 1 shows the results of calculations of the coefficients b1, b2 and $K_L$ in equation (8) for various values of the cutoff frequency of the low-pass filter. These results are obtained when the sampling frequency fs (=1/T) is 32 kHz. When this frequency fs is substituted in A=tan ($\omega$DT/2), we obtain $$A = \tan(3.14159 \times fc/32000) \qquad (9)$$

The value of A thus obtained is substituted in $1 + \sqrt{2A} + A^2 = B$ to obtain B. The coefficients b1, b2 and $K_L$ are obtained based on these values of A and B. In this table, the cutoff frequency is varied by 500 Hz each time.

TABLE 1

| fc(Hz) | $K_L$ | b1 | b2 |
|---|---|---|---|
| 500 | 2.25158EXP-3 | −1.86136 | 0.870368 |
| 1000 | 8.44267EXP-3 | −1.72378 | 0.757547 |
| 1500 | 1.78631EXP-2 | −1.58794 | 0.65939 |
| 2000 | 2.99545EXP-2 | −1.45424 | 0.574062 |
| 2500 | 4.42796EXP-2 | −1.32289 | 0.500007 |
| 3000 | 6.04984EXP-2 | −1.19391 | 0.435908 |
| 3500 | 7.83487EXP-2 | −1.06726 | 0.380659 |
| 4000 | 0.097631 | −0.94281 | 0.333334 |
| 4500 | 0.118197 | −0.820372 | 0.293159 |
| 5000 | 0.139939 | −0.699739 | 0.259495 |
| 5500 | 0.162786 | −0.580677 | 0.231821 |
| 6000 | 0.186694 | −0.462939 | 0.209716 |
| 6500 | 0.211645 | −0.346267 | 0.192849 |
| 7000 | 0.237644 | −0.230397 | 0.180972 |
| 7500 | 0.264712 | −0.115066 | 0.173914 |
| 8000 | 0.292893 | −2.09494EXP-6 | 0.171573 |
| 8500 | 0.322244 | 0.115061 | 0.173914 |
| 9000 | 0.352841 | 0.230394 | 0.180972 |
| 9500 | 0.384778 | 0.346262 | 0.192848 |
| 10000 | 0.418162 | 0.462934 | 0.209715 |
| 10500 | 0.453123 | 0.580672 | 0.23182 |
| 11000 | 0.489807 | 0.699733 | 0.259494 |
| 11500 | 0.528381 | 0.820365 | 0.293157 |
| 12000 | 0.569034 | 0.942803 | 0.333331 |
| 12500 | 0.611979 | 1.06726 | 0.380657 |
| 13000 | 0.657453 | 1.19391 | 0.435905 |
| 13500 | 0.705721 | 1.32288 | 0.500003 |
| 14000 | 0.757074 | 1.45424 | 0.574058 |
| 14500 | 0.811829 | 1.58793 | 0.659386 |
| 15000 | 0.870328 | 1.72377 | 0.757542 |
| 15500 | 0.932929 | 1.86136 | 0.870362 |
| 16000 | 0.999996 | 1.99999 | 0.999992 |

Figure 4:
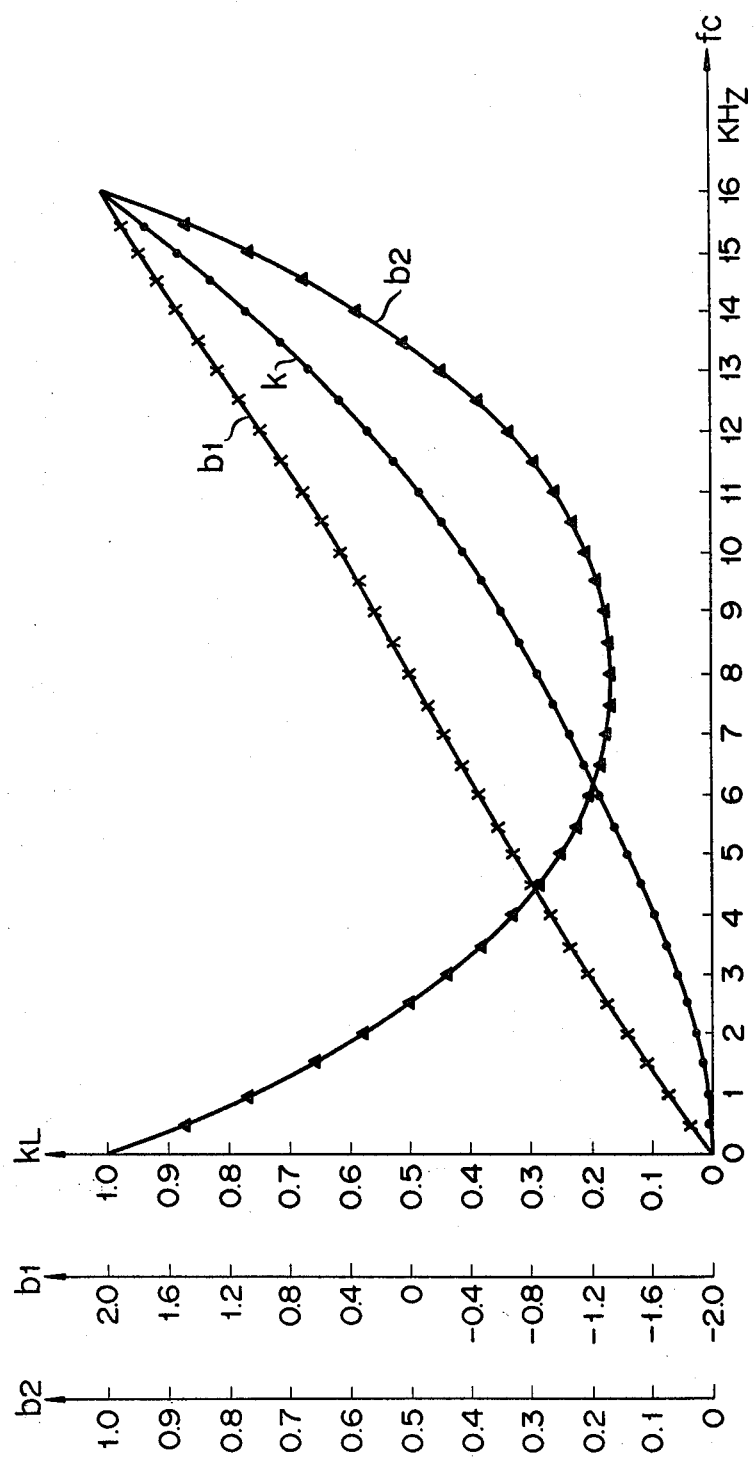
FIG. 4 is a graph showing the relation between the cutoff frequency and the coefficients b1, b2 and K with the filter shown in FIG. 3.

FIG. 4 shows the results when the values of Table 1 are plotted.

In the case of a low-pass filter, it is preferable that the absolute value of the transfer function H(z) approaches 1 as the frequency of the input signal approaches 0. Therefore, $$\lim_{z^{-1} \to 1} |H(z)| = 1 \qquad (10)$$

When equation (10) is substituted into equation (8), we obtain $$K_L = (1+b1+b2)/4 \quad (11)$$

Figure 1:
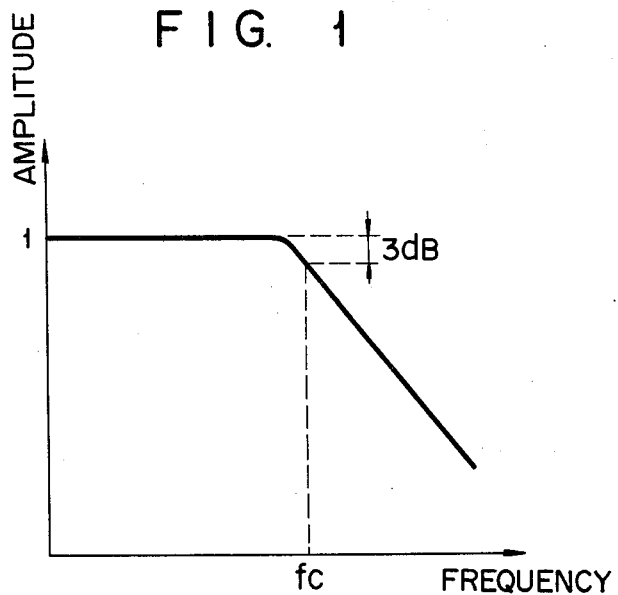
FIG. 1 shows a characteristic curve of a standard analog low-pass filter.
Figure 2:
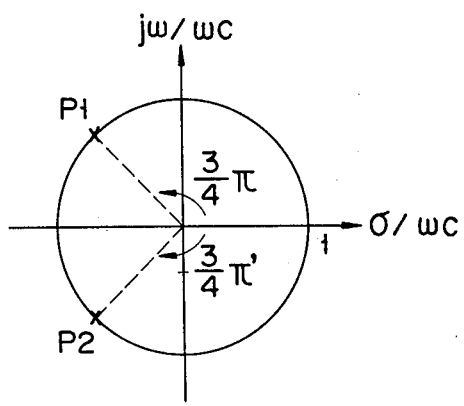
FIG. 2 shows the poles of the transfer function in the S-plane for the low-pass filter.
Figure 3:
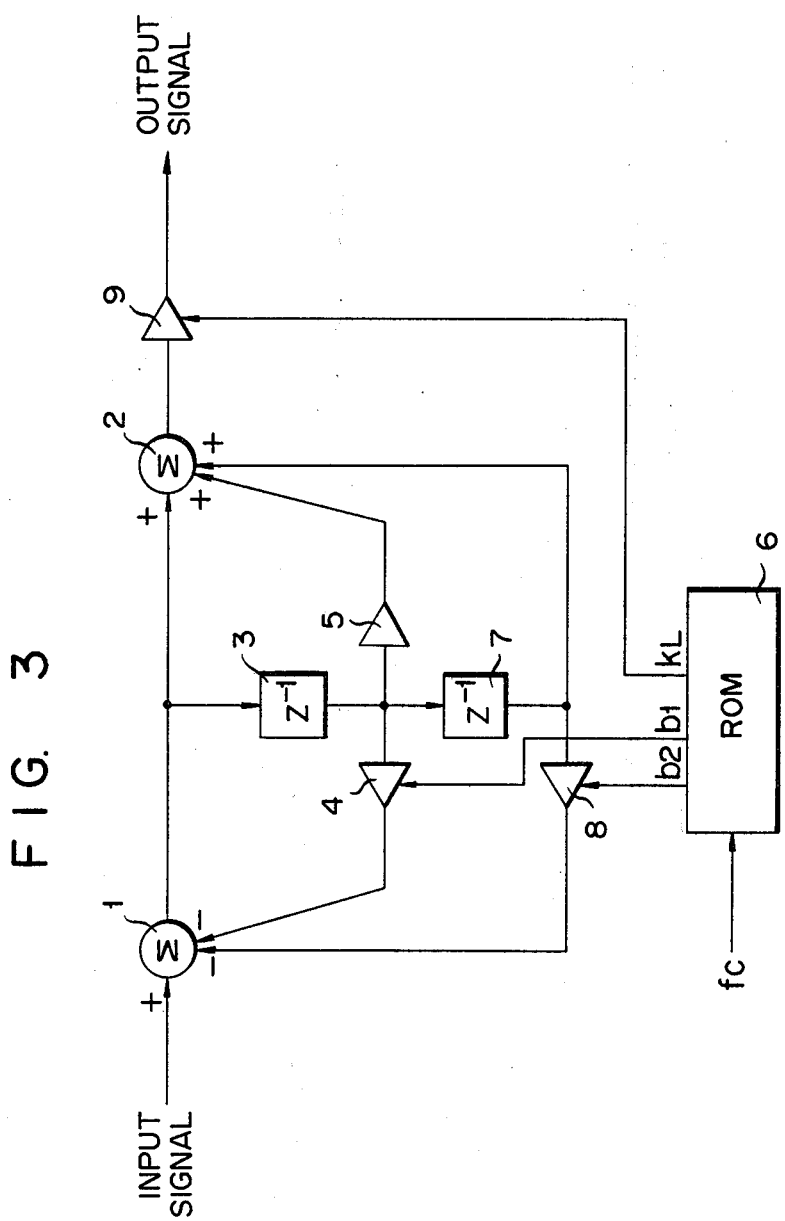
FIG. 3 shows the circuit construction of a conventional Butterworth low-pass filter.
Figure 5:
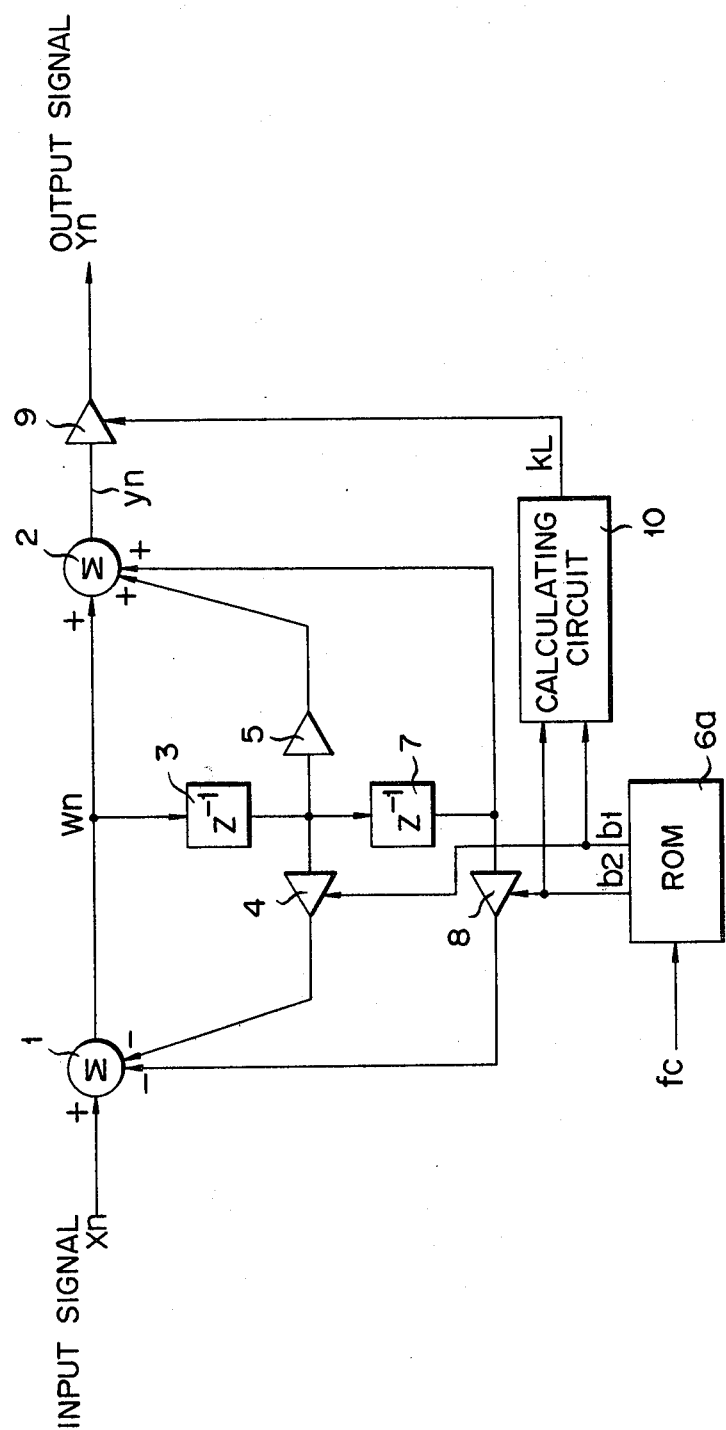
FIG. 5 shows the circuit construction of a digital low-pass filter according to the present invention.

FIG. 5 shows an embodiment in which the data $K_L$ is obtained using the coefficients b1 and b2 stored in the ROM based on the relation expressed by equation (11). Referring to FIG. 5, a calculating circuit 10 calculates the data $K_L$ according to equation (11). The calculating circuit 10 receives the data b1 and b2 from a ROM 6a and outputs the data $K_L$. The data $K_L$ thus obtained is supplied to the multiplier 9. The remaining parts of the circuit in FIG. 5 are the same as those in FIG. 3 and are denoted by the same reference numerals.

Figure 6:
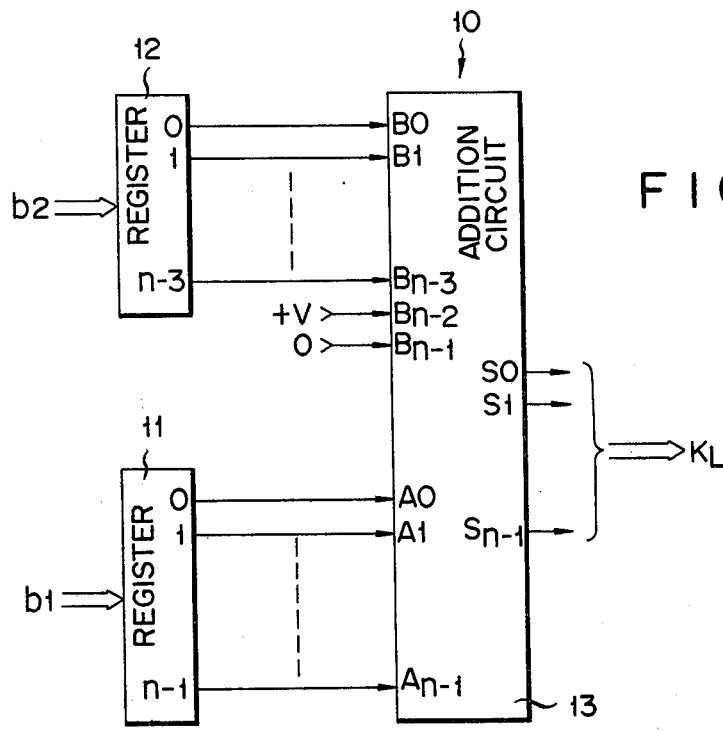
FIG. 6 shows a particular circuit diagram of the coefficient calculating circuit in FIG. 5.
Figure 7:
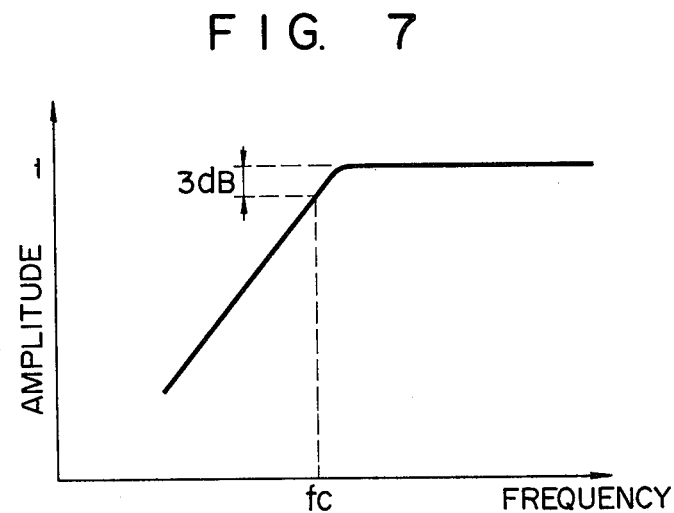
FIG. 7 shows a frequency characteristic curve of a high-pass filter.

This calculating circuit 10 is constructed as shown in FIG. 6. Referring to FIG. 6, the coefficient data b1 is of n bits (n=0, ... n−1) and is supplied to a register 11 from the ROM 6a. Since $|b1|<2$ as may be seen from Table 1, the decimal point is the second bits from the most significant bit (n−1) and the most significant bit (n−2) becomes the sign bit. The data b1 is expressed as the complement of 2.

The coefficient data b2 is of n−2 bits (n=0, ... n−3) and is output from the ROM 6a to be supplied to a register 12. Since $0<b2<1$ from Table 1, the decimal place values are constructed from n−2 bits.

Such data b1 and b2 are supplied to respective input terminals A0, A1, ... An−1 and B0, B1, ... Bn−3 of an adder 13. The adder 13 further includes input terminals Bn−2 and Bn−1. A voltage +V representing the logic level "1" is constantly applied to the input terminal Bn−2. A voltage of 0 volts representing the positive sign is constantly applied as logic level "0" to the input terminal Bn−1.

The adder 13 performs the calculation of equation (11), and the bit output representing the data K is supplied to its output terminals S0, S1, ... Sn−1. Division of (1+b1+b2) by 4 in equation (11) implies a shift of the decimal point of the addition result of (1+b1+b2) by 2 bits toward the upper digits. The values from equation (11) may be simply calculated by the adder 13. The data $K_L$ output at the output terminals S0, S1, ... Sn−1 is handled as data of n bits after the decimal point and becomes a positive integer such that $0<K_L<1$.

In a digital low-pass filter of the construction shown in FIGS. 5 and 6, the data representing a desired cutoff frequency fc is input as an address signal to the ROM 6a. The coefficient data b1 and b2 corresponding to this frequency fc is read out from the ROM 6a. The obtained data b1 and b2 is supplied to the multipliers 4 and 8, respectively, and to the calculating circuit 10.

Thus, when an input signal Xn is applied to the adder 1 in FIG. 5, an output Wn of the adder 1 is $$Wn = Xn - b1z^{-1}Wn - b2z^{-2}Wn$$
$$= Xn - (b1z^{-1} + b2z^{-2})Wn$$

Therefore $$Wn = \frac{1}{(1 + b1z^{-1} + b2z^{-2})} Xn \quad (12)$$

Similarly, an output yn of the adder 2 is $$yn = Wn + az^{-1}Wn + z^{-2}Wn$$
$$= (1 + az^{-1} + z^{-2})Wn$$

If the coefficient a of the multiplier 5 is set at (2), we obtain $$yn = (1+z^{-1})^2 Wn \quad (13)$$

When equation (12) is substituted into equation (13), $$yn = \frac{(1 + z^{-1})^2}{1 + b1z^{-1} + b2z^{-2}} Xn \quad (14)$$

Since the output yn of the adder 2 is multiplied at the multiplier 9 by the output data $K_L$ of the calculating circuit 10, the output signal Yn of the adder 2 is given as $$Yn = K_L yn = \frac{K_L(1 + z^{-1})^2}{1 + b1z^{-1} + b2z^{-2}} Xn \quad (15)$$

Therefore, the transfer function of the filter shown in FIG. 5 is given by $$H(z) = \frac{Yn}{Xn} = \frac{K_L(1 + z^{-1})^2}{1 + b1z^{-1} + b2z^{-2}}$$

which is identical to equation (8).

Equation (11) was obtained from equation (10) in the above embodiment. However, equation (11) may alternatively be obtained by employing $b1 = 2(A^2-1)/B$ and $b2 = (1 - \sqrt{2}A + A^2)/B$ and $K_L = A^2/B$.

It is to be further understood that it is possible to calculate the coefficient b1 using b2 and $K_L$ or to calculate the coefficient b2 using b1 and $K_L$ instead of calculating the coefficient $K_L$ using the coefficients b1 and b2.

Although the embodiment shown in FIGS. 5 and 6 is the case wherein the present invention is applied to a Butterworth low-pass filter, the present invention may also be applied to a low-pass filter of another type, a high-pass filter, a band-pass filter, or a filter of higher order.

An embodiment will now be described wherein the present invention is applied to a Butterworth high-pass filter. Referring to equation (1) described above, the transfer function H(S) of a high-pass filter with cutoff frequency fc may be given as $$H(S) = S^2/(S^2 + \sqrt{2}\, S\omega c + \omega c^2) \quad (16)$$

by substituting $\omega c/s$ for the Laplace variable S. When this analog transfer function H(z) undergoes the bilinear z-transform utilizing the relation $$S = \frac{2}{T}\left(\frac{1 - z^{-1}}{1 + z^{-1}}\right) \quad (17)$$

to obtain the transfer function H(z) of the digital high-pass filter, we obtain from equations (16) and (17)

$$H(z) = \frac{K_H(1 - z^{-1})^2}{1 + b1z^{-1} + b2z^{-2}} \quad (18)$$

where $$b1 = 2(A^2 - 1)/B$$

$$b2 = (1 - \sqrt{2}\, A + A^2)/B$$

-continued $$K_H = 1/B$$

When $K_H$ is expresssed using b1 and b2 in a manner similar to the case of a low-pass filter, $$K_H = (1 - b1 + b2)/4 \qquad (19)$$

When equations (8) and (18) are compared, it is seen that their denominators are identical. The numerator for the low-pass filter is $K_L(1+z^{-1})^2$ and that for the high-pass filter is $K_H(1-z^{-1})^2$. This indicates that the coefficient $+2$ for the multiplier 5 of the low-pass filter need only be changed to $-2$ in the high-pass filter. When calculating K with equations (11) and (19), the sign of b1 alone changes from positive to negative. Therefore, by changing the sign of the coefficient (2) of the multiplier 5 from positive to negative while simultaneously changing the sign of b1 from positive to negative utilizing a signal for switching from a low-pass filter to a high-pass filter, the low-pass filter of FIG. 5 may be easily used as a high-pass filter.

Figure 8:
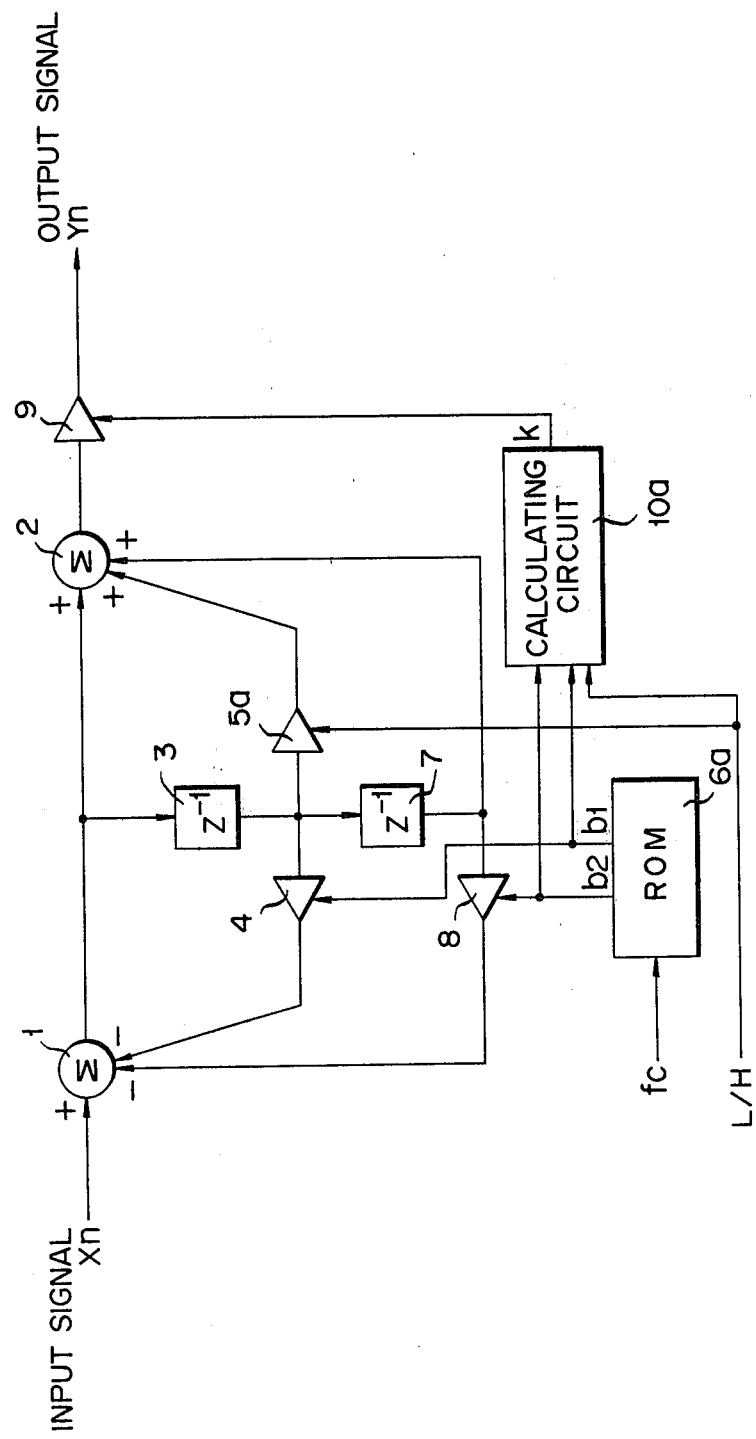
FIG. 8 shows the circuit construction of an embodiment which may be switched to operate as a low-pass filter and a high-pass filter.

FIG. 8 shows an embodiment constructed according to the principle described above and the same parts are denoted by the same reference numerals as in FIG. 5. Referring to FIG. 8, a switching signal L/H for switching the operation mode between the low-pass filter and the high-pass filter is supplied to a multiplier 5a and to a calculating circuit 10a. The switching signal L/H is, for example, a signal which becomes logic level "0" for the low-pass filter and logic level "1" for the high-pass filter.

Figure 9:
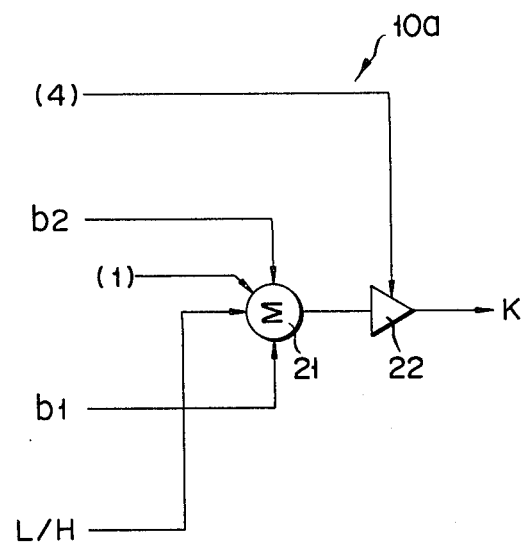
FIG. 9 shows a particular circuit diagram of the coefficient calculating circuit in FIG. 8.

The calculating circuit 10a comprises, as shown in FIG. 9, an adder 21 for receiving data b1 and b2, the signal (1), and the switching signal L/H from the ROM 6a; and a multiplier 22 to which are supplied an output of the adder 21 and a signal representing the divisor (4).

The mode of operation of the circuit shown in FIGS. 8 and 9 will now be described. For operating the filter shown in FIG. 8 as a low-pass filter, the switching signal L/H becomes "0". When this signal "0" is supplied, the multiplier 5a multiplies the output of the delay element 3 by a factor of 2. That is, the sign bit of the coefficient (2) in the multiplier 5a becomes "0". In the calculating circuit 10a, the sign of b1 becomes positive for calculating $(1+b1+b2)$, the sum of all the input data (b1, b2, 1). The transfer function H(z) obtained in this case becomes as expressed by equation (8). The circuit shown in FIG. 8 operates as a low-pass filter.

For operating the circuit as a high-pass filter, on the other hand, the switching signal L/H becomes "1". Then, at the multiplier 5a, the sign bit of the coefficient (2) becomes "1" and the output of the delay element 3 is multiplied by $(-2)$. On the other hand, at the calculating circuit 10a, the sign bit of b1 becomes "1" whereupon the sign of b1 becomes negative and the sum of all the input data (1, $-$b1, b2) is calculated, giving $(1-b1+b2)$. Thus, the transfer function H(z) in this case may be as expressed by equation (18) and the circuit shown in FIG. 8 operates as a high-pass filter.

Since the switching between the low-pass filter and the high-pass filter may be accomplished by supplying a switching signal L/H in a simple manner, and the coefficient K ($K_L$, $K_H$) may be calculated using the coefficients b1 and b2, a digital filter device may be realized which is multi-functional and which requires only a small capacity ROM.

Figure 10A:
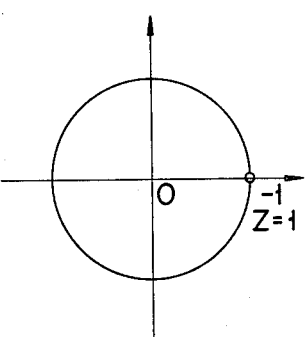
FIGS. 10A and 10B are graphs showing the zero positions of the amplitude characteristics obtained with the low-pass filter and the high-pass filter, respectively.

The above description has been made with reference to a Butterworth filter. However, when the transfer function H(z) of a digital filter is represented as $$H(z) = K \cdot \frac{1 + a1z^{-1} + a2z^{-2}}{1 + b1z^{-1} + b2z^{-2}} \qquad (20)$$

the amplitude characteristic is such that $|H(z)|$ of the low-pass filter approaches 0 dB (i.e., gain is 1) as the frequency of the input signal becomes lower. In other words, in the $z^{-1}$-plane, $|H(z)|=1$ when $z^{-1}$ approaches 1 on the unit circle (FIG. 10A).

Therefore, from equation (20), $$\lim_{z^{-1} \to 1} |H(z)| = \lim_{z^{-1} \to 1} \left| K_L \cdot \frac{1 + a1z^{-1} + a2z^{-2}}{1 + b1z^{-1} + b2z^{-2}} \right|$$

$$= \left| K_L \frac{1 + a1 + a2}{1 + b1 + b2} \right|$$

$$= 1$$

where K is the gain. Since K is generally a positive integer, $$K_L = \left| \frac{1 + b1 + b2}{1 + a1 + a2} \right| \qquad (21)$$

Figure 10B:
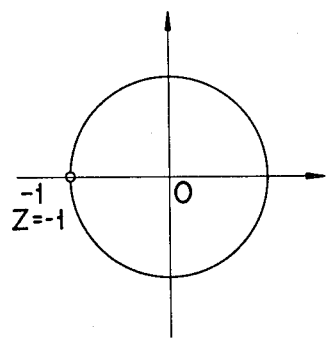

To the contrary, the amplitude characteristic of the high-pass filter is such that $|H(z)|$ approaches 0 dB (gain is 1) as the frequency of the input signal becomes higher. In other words, in the $z^{-1}$-plane, $|H(z)|=1$ when $z^{-1}$ approaches $-1$ on the unit circle (FIG. 10B).

Therefore, from equation (20), $$\lim_{z^{-1} \to 1} |H(z)| = \lim_{z^{-1} \to 1} \left| K_H \cdot \frac{1 + a1z^{-1} + a2z^{-2}}{1 + b1z^{-1} + b2z^{-2}} \right|$$

$$= \left| K_H \frac{1 - a1 + a2}{1 - b1 + b2} \right|$$

$$= 1$$

where K is the gain. Since K is generally a positive integer, $$K_H = \left| \frac{1 - b1 + b2}{1 - a1 + a2} \right| \qquad (22)$$

In this manner, the coefficient K may be expressed using the other coefficients a1, a2, b1 and b2 for both the low-pass filter and the high-pass filter. FIG. 11 shows the circuit construction of a circuit for calculating the coefficient K based on equations (21) and (22). Reference numerals 23 and 24 denote adders; the adder 23 performs the addition $(1+b1+b2)$ and the adder 24 performs the addition $(1+a1+a2)$ in the case if the low-pass filter (when the switching signal L/H is, for example, "0"). Thus, at a multiplier 25, the division within the absolute value sign of equation (21) is performed, and the result is supplied to an absolute value circuit 26 to provide the value of the coefficient $K_L$. When the circuit operates as a high-pass filter, the switching signal L/H becomes "1", the adder 23 performs the operation $(1-b1+b2)$ and the adder 24 performs the operation $(1-a1+a2)$. As a result, the division within the absolute value sign of equation (22) is performed at the multiplier 25. Consequently, the output is input to the absolute value circuit 26 to provide the value of the coefficient $K_H$. Thus, the present invention is not limited to a Butterworth filter but may be applied to a digital filter device of general type.

The transfer function of a band-pass filter having the cutoff frequencies fc1 and fc2 as shown in FIG. 12 is, in general, complex as compared with the transfer function of a low-pass filter or a high-pass filter, and the circuit construction also becomes complex and of large scale. For this reason, when constructing a band-pass filter, a low-pass filter and a high-pass filter are cascade-connected in some cases. For example, the circuit shown in FIG. 5 and that shown in FIG. 8 may be cascade-connected. In this case the circuitry of FIG. 8 is set as a high-pass filter. However, the circuit construction of the band-pass filter designated in this manner becomes extremely bulky and complex.

Figure 13:
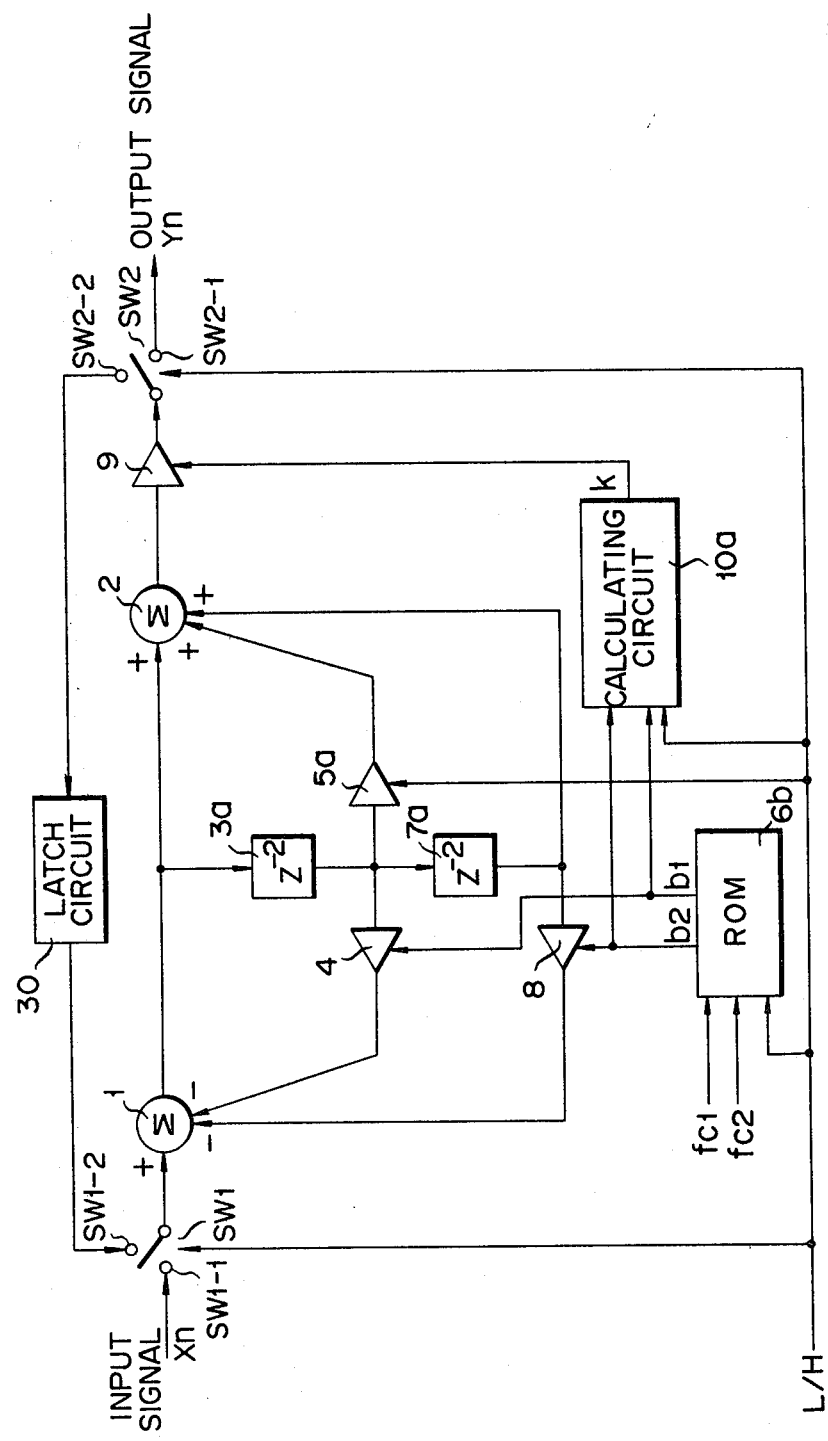
FIG. 13 shows the circuit construction of an embodiment according to which the present invention is applied to a band-pass filter.

FIG. 13 shows a band-pass filter of an embodiment constructed to overcome these problems. The same parts are designated by the same reference numerals as in FIGS. 5 and 8.

Referring to FIG. 13, an input signal Xn is supplied to a contact SW1-1 of a change-over switch SW1. An output of the change-over switch SW1 is supplied to the adder 1. An output of the multiplier 9 is output as an output signal Yn through a contact SW2-1 of a change-over switch SW2. The change-over switch SW2 has another contact SW2-2 which is connected to the input side of a latch circuit 30. An output of the latch circuit 30 is supplied to another contact SW1-2 of the change-over switch SW1.

The contacts of the change-over switches SW1 and SW2 are switched by the switching signal L/H for switching between the low-pass filter and the high-pass filter. For example, when the signal L/H is "1", the switch SW1 contacts the contact SW1-1 and the switch SW2 contacts the contact SW2-2.

A ROM 6b receives two cutoff frequencies fc1 and fc2 of the band-pass filter supplied as address signals and outputs corresponding b1 and b2. For example, when the L/H switching signal is "1", the high-pass filter cutoff frequency fc2 (FIG. 12) is received as the address signal for outputting the data b1 and b2 for the transfer function for the high-pass filter. For this purpose, the switching signal L/H is also supplied to the ROM 6b. Delay elements 3a and 7a have a delay time which is twice the sampling time T. Each of these elements may be considered as a series-connection of two delay elements of the sampling time T. The calculating circuit 10a is of the construction shown in FIG. 9.

The mode of operation of this embodiment will now be described. Describing the outline of the operation of this embodiment first, the digital filter device in FIG. 13 first operates as a high-pass filter (cutoff frequency fc2: variable) in response to the input signal Xn. In response to the result data, the digital filter device operates as a low-pass filter (cutoff frequency fc1: variable). Consequently, the input signal Xn is output as an output Yn through the band-pass filter having the amplitude characteristics shown in FIG. 12.

Figure 14:
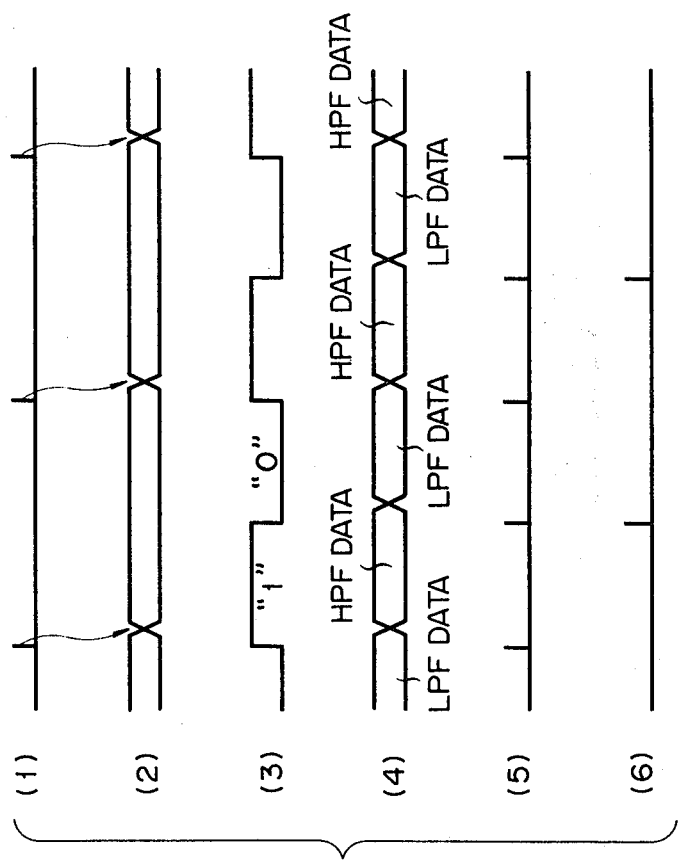
FIG. 14 is a timing chart for explaining the operation of the circuit shown in FIG. 13.

The input signal Xn from the outside is input to the adder 2 after being sampled at a timing shown in FIG. 14(1) through the contact SW1-1 of the switch SW1. Therefore, the input signal Xn is changed as shown in FIG. 14(2). At this time, the switching signal L/H is alternately changed between "1" and "0" as shown in FIG. 14(3). At the ROM 6b, the coefficient data b1 and b2 corresponding to a desired cutoff frequency fc2 is read out. At the calculating circuit 10a, the operation as represented by equation (19) is performed to calculate the coefficient data $K_H$. With a digital filter device as shown in FIG. 14(4), the data for a high-pass filter as shown in equation (18) is calculated. The result data is latched by the delay elements 3a and 7a at a timing shown in FIG. 14(5). The result data is also read in the latch circuit 30 at a timing shown in FIG. 14(6) through the contact SW2-2 of the switch SW2. The data read in the delay elements 3a and 7a is delayed until the time for performing the operation as a high-pass filter. The data output from the delay elements 3a and 7a after the switching signal L/H is switched over to "0" is the result data obtained by the preceding operation of the low-pass filter. At this switching, the coefficient data b1 and b2 corresponding to the desired cutoff frequency fc1 is read out from the ROM 6b, and at the same time, the operation as represented by equation (11) is performed at the calculating circuit 10a to calculate the coefficient data $K_L$. Therefore, in this digital filter device, in response to the output of the latch circuit 30 supplied through the contact SW1-2 of the switch SW1 and the outputs of the delay elements 3a and 7a, the data is calculated through the low-pass filter as shown in equation (8). The result data Yn is output to the outside through the contact SW2-1 of the switch SW2.

In accordance with this embodiment, the fact that the coefficients b1 and b2 of the transfer function of a digital filter are the same when the cutoff frequencies of a low-pass filter and a high-pass filter are equal is utilized to store a single kind of data (b1, b2) in the ROM 6b. The fact that the coefficient data $K(K_L, K_H)$ is expressed by equations (11) and (19) is utilized to calculate it at the calculating circuit 10a based on the outputs b1 and b2 of the ROM 6b. Accordingly, the storage capacity of the ROM 6b is greatly reduced.

Although the digital filter device was first operated as a high-pass filter and then as a low-pass filter in the above embodiment, the reverse operation is similarly applicable.

Although the above description was made with reference to a second-order filter in the above embodiments, it is possible to construct a filter of higher order to which the present invention is similarly applicable.

Figure 15:
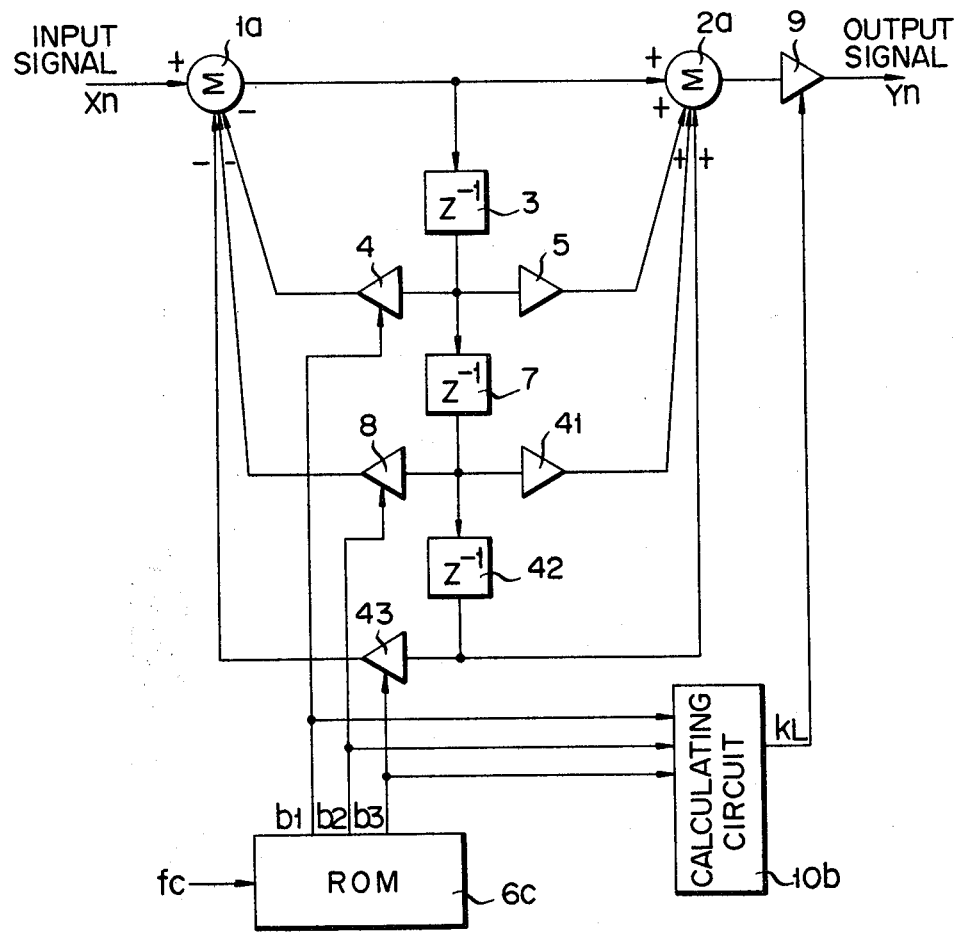
FIG. 15 shows the circuit construction of an embodiment in which the present invention is applied to a third-order Butterworth low-pass filter.

FIG. 15 shows an embodiment according to which the present invention is applied to a third-order filter as an example of a filter of higher order. The transfer function H(S) of a standard analog Butterworth low-pass filter of third order may be given by $$H(S) = \frac{1}{(S+1)\left(S+\frac{1}{2}-j\frac{\sqrt{3}}{2}\right)\left(S+\frac{1}{2}+j\frac{\sqrt{3}}{2}\right)}$$

$$= \frac{1}{(S+1)(S^2+S+1)}$$

When S is replaced by $S/\omega c$ for transforming it into a transfer function of a low-pass filter having a cutoff frequency $\omega c$, we obtain $$H_L(S) = \frac{1}{\left(\frac{S}{\omega c} + 1\right)\left(\frac{S^2}{\omega c^2} + \frac{S}{\omega c} + 1\right)} \quad (23)$$

$$= \frac{\omega c^3}{(S + \omega c)(S^2 + S\omega c + \omega c^2)}$$

When equation (23) is S-z transformed and the following substitutions are made:

$$a = \omega c + \frac{2}{T},$$

$$b = \omega c - \frac{2}{T},$$

$$c = \frac{4}{T^2} + \frac{2\omega c}{T} + \omega c^2,$$

$$d = -\frac{8}{T^2} + 2\omega c^2,$$

$$e = \frac{4}{T^2} - \frac{2\omega c}{T} + \omega c^2$$

we obtain $$H_L(z) = \frac{(1 + z^{-1})^3 \omega c^3}{(a + bz^{-1})(c + dz^{-1} + ez^{-2})} \quad (24)$$

$$= \frac{\frac{\omega c^3}{ac}(1 + 3z^{-1} + 3z^{-2} + z^{-3})}{1 + \frac{bc + ad}{ac}z^{-1} + \frac{bd + ae}{ac}z^{-2} + \frac{be}{ac}z^{-3}}$$

$H_L(z)$ may be generally expressed as $$H_L(z) = \frac{K_L(1 + z^{-1})^3}{1 + b1z^{-1} + b2z^{-2} + b3z^{-3}} \quad (25)$$

where $K_L = \omega c^3/ac$.

The following calculations are performed, $$\frac{1 + b1 + b2 + b3}{1 + a1 + a2 + a3} = \frac{1 + b1 + b2 + b3}{1 + 3 + 3 + 1}$$

$$= \frac{1 + \frac{bc + ad}{ac} + \frac{bd + ae}{ac} + \frac{be}{ac}}{8}$$

$$= \frac{ac + bc + ad + bd + ae + be}{8ac}$$

When the values of a to e, respectively, are substituted into $ac + bc + ad + bd + ae + be$, then $ac + bc + ad + bd + ae + be = 8\omega c^3$. Therefore, $$K_L = \frac{1 + b1 + b2 + b3}{8} \quad (26)$$

Therefore, a third-order Butterworth low-pass filter may be constructed as shown in FIG. 15 as may be seen from equation (25).

Referring to FIG. 15, delay elements 3, 7 and 42 each has a function of delaying the sampling time. Multipliers 5 and 41 are for multiplying by coefficient 3. A multiplier 43 is for multiplying coefficient data b3 from a ROM 6c by the output from the delay element 42. The ROM 6c is address-designated by the cutoff frequency fc to output data b1, b2 and b3. This data is supplied to a calculating circuit 10b which performs the operation according to equation (26). The output data K from the circuit 10b is supplied to the multiplier 9.

The transfer function of a still higher order (nth-order/mth-order) may be expressed as follows $$H(z) = \frac{K(1 + a1z^{-1} + a2z^{-2} + \ldots + anz^{-n})}{1 + b1z^{-1} + b2z^{-2} + \ldots + bmz^{-m}} \quad (27)$$

A transfer function may be obtained by a circuit realizing equation (27).

In the case of a low-pass filter, $$\lim_{z^{-1} \to 1} |H(z)| = \left|\frac{1 + a1 + a2 + \ldots + an}{1 + b1 + b2 + \ldots + bm}\right| \cdot K_L = 1$$

where $$K_L = \frac{1 + b1 + b2 + \ldots bm}{1 + a1 + a2 + \ldots an}$$

In the case of a high-pass filter, $$\lim_{z^{-1} \to 1} |H(z)| = \left|\frac{1 - a1 + a2 - a3 + \ldots + (-1)^n an}{1 - b1 + b2 - b3 + \ldots + (-1)^m bm}\right|.$$

$$K_H = 1$$

where $$K_H = \left|\frac{1 - b1 + b2 - b3 + \ldots + (-1)^m bm}{1 - a1 + a2 - a3 + \ldots + (-1)^n an}\right|$$

The present invention may also be applicable to various kinds of filters such as those used in electronic musical instruments and acoustic equipments of digital control, to signal processing systems performing various signal processings and to a speech sound synthesizing equipment for synthesizing speech signals, other than the above-mentioned low-pass filters, high-pass filters and band-pass filters.

In summary, by calculating at least one coefficient of the transfer function using the other coefficients, the required storage capacity of the memory is reduced by the memory area for storing the coefficient to be calculated, so that the area of the memory on the chip may be reduced, thereby reducing the chip area and facilitating the multi-functionality of the digital filter formed on the chip. Although the calculating circuit is added for calculating the coefficient, the area on the chip required for this purpose is small so that the net chip area may be reduced compared with the conventional case.

What is claimed is:

1. A digital filter device comprising:
   a digital filter means for filtering a digital input signal in accordance with a predetermined transfer function H(z), said transfer function H(z) being $$H(z) = \frac{K(1 \pm z^{-1})^2}{1 + b1z^{-1} + b2z^{-2}}$$

said digital filter means including means for carrying out a calculating operation;
a memory means coupled to said digital filter means for storing coefficients b1 and b2 and for selectively delivering said coefficients b1 and b2 to said digital filter means for using in a calculating operation in said digital filter means; and a coefficient calculating means coupled to said memory means for calculating a coefficient K using coefficients b1 and b2 read out from said memory means, said coefficient calculating means performing an operation $$K = (1 \pm b1 + b2)/4$$

to calculate the coefficient K, and said coefficient K being used for the calculating operation in said digital filter means;

said coefficient calculating means including:
first and second registers to which are respectively supplied the coefficients b1 and b2 from said memory means;
a generating means for generating a data of numeral "1" (+V); and
an arithmetic means for receiving outputs from said first and second registers and data of numeral "1" generated from said generating means for performing the addition $(1 \pm b1 + b2)$ and for shifting a decimal point of the addition result by 2 bits toward an upper digit for to obtain said coefficient K.

2. A digital filter device comprising:
a digital filter means for filtering a digital input signal in accordance with a predetermined transfer function H(z), said transfer function H(z) being $$H(z) = \frac{K(1 \pm z^{-1})^2}{1 + b1z^{-1} + b2z^{-2}}$$

said digital filter means including means for carrying out a calculating operation;
a memory means coupled to said digital filter means for storing coefficients b1 and b2 and for selectively delivering said coefficients b1 and b2 to said digital filter means for use in a calculating operation in said digital filter means; and
a coefficient calculating means coupled to said memory means for calculating a coefficient K using coefficients b1 and b2 read out from said memory means, said coefficient calculating means performing an operation $$K = (1 \pm b1 + b2)/4$$

to calculate the coefficient K, and said coefficient K being used for the calculating operation in said digital filter means;

said coefficient calculating means including:
generating means for generating a data of numeral "1" (+V);
an adder to which is supplied the coefficient data b1 and b2 delivered from said memory means and said data of numeral "1" generated from said generating means for performing the addition $(1 \pm b1 + b2)$; and
a divider for dividing the output from said adder by 4.

3. A digital filter device comprising:
a digital filter means for filtering a digital input signal in accordance with a predetermined transfer function H(z), said transfer function H(z) being $$H(z) = \frac{K(1 \pm z^{-1})^2}{1 + b1z^{-1} + b2z^{-2}}$$

said digital filter means including means for carrying out a calculating operation;
a memory means coupled to said digital filter means for storing coefficients b1 and b2 and for selectively delivering said coefficients b1 and b2 to said digital filter means for use in a calculating operation in said digital filter means; and
a coefficient calculating means coupled to said memory means for calculating a coefficient K using coefficients b1 and b2 read out from said memory means, said coefficient calculating means performing an operation $$K = (1 \pm b1 + b2)/4$$

to calculate the coefficient K, and said coefficient K being used for the calculating operation in said digital filter means;
said digital filter means including a circuit for performing one of the operations $(1+z^{-1})^2$ and $(1-z^{-1})^2$ according to a switching signal for switching between a low-pass filter and a high-pass filter; and
said coefficient calculating means including means for setting the sign of the coefficient b1 in the operation $(1 \pm b1 + b2)$ to positive or negative according to said switching signal.

4. A digital filter device comprising:
a digital filter means for filtering a digital input signal in accordance with a predetermined transfer function, said digital filter means including means for carrying out a calculating operation;
a memory means coupled to said digital filter means for selectively delivering to said digital filter means coefficients used for a calculating operation in said digital filter means; and
a coefficient calculating means coupled to said memory means using coefficients (b1, b2) delivered from said memory means to calculate at least one additional coefficient (K) used for said calculating operation in said digital filter means;
switch control means coupled to said digital filter means for switching and controlling a plurality of operation modes of said digital filter means;
means for supplying a mode switching signal to said switch control means for switching between a low-pass filter mode and high-pass filter mode in said digital filter means; and
first switching means included in said switch control means for supplying an output of said digital filter means to a latch circuit when said mode switching signal indicates said low-pass filter mode and for supplying the output to an external circuit when said mode switching signal indicates said high-pass filter mode; and second switching means included in said switch control means for supplying an input signal to said digital filter means in said law pass filter mode and for supplying a signal latched at said latch circuit to said digital filter means in said high pass filter mode.

5. A digital filter device according to claim 4, wherein coefficients output from said memory means in said low-pass filter mode and high-pass filter mode correspond to different variable cutoff frequencies.

6. A digital filter device according to claim 5, wherein said digital filter means comprises a Butterworth filter of second order or more and is constructed to perform the filtering operation based upon a transfer function $$H(z) = \frac{K(1 + a1z^{-1} + a2z^{-2} + \ldots anz^{-n})}{1 + b1z^{-1} + b2z^{-2} + \ldots bmz^{-m}}$$

7. A digital filter device comprising:
a digital filter means for filtering a digital input signal in accordance with a predetermined transfer function H(z), said transfer function H(z) being, $$H(z) = \frac{K(1 + a1z^{-1} + a2z^{-2} + \ldots + anz^{-n})}{1 + b1z^{-1} + b2z^{-2} + \ldots + bmz^{-m}}$$

said digital filter means including means for carrying out a calculating operation;
a memory means coupled to said digital filtering means for storing coefficients b1, b2, ..., bm, a1, a2, ..., $a_n$ and for selectively delivering said coefficients b1, b2, ..., bm, a1, a2, ..., $a_n$ to said digital filter means for use in a calculating operation in said digital filter means; and
a coefficient calculating means coupled to said memory means for calculating said coefficient K using coefficients b1, b2, ..., bm, a1, a2, ..., $a_n$ read out from said coefficient calculating means by performing at least one of the following operations:

$$K = \frac{1 + b1 + \ldots + bm}{1 + a1 + \ldots + a_n}$$

or $$K = \frac{1 - b1 + \ldots + (-1)^m bm}{1 - a1 + \ldots + (-1)^n a_n}$$

to calculate said coefficient K, and said coefficient K being used for said calculating operation in said digital filterimg means.

8. A digital filter device according to claim 7, further comprising switch control means coupled to said digital filter means for switching and controlling the operation content of said digital filter means according to a switching signal for switching the filter modes of the digital filter means.

9. A digital filter device comprising:
a digital filter means for filtering a digital input signal in accordance with a predetermined transfer function H(z) of a second order Butterworth filter, said digital filter means including means for carrying out a calculating operation;
a memory means coupled to said digital filter means for selectively delivering to said digital filter means coefficients (b1, b2) used for a calculating operation in said digital filter means; and
a coefficient calculating means coupled to said memory means and including means for performing the calculation K=(1+b1+b2)/4, using coefficients (b1, b2) delivered from said memory means, to calculate at least one additional coefficient (K), other than said coefficients (b1, b2) delivered to said coefficient calculating means, said delivered coefficients and said at least one additional coefficient being coupled to said digital filter means to be used for said calculating operation in said digital filter means;
said second order Butterworth filter having the following transfer function H(z):

$$H(z) = \frac{K(1 \pm z^{-1})^2}{1 + b1z^{-1} + b2z^{-2}}$$

said coefficient K being said additional coefficient calculated by said coefficient calculating means using said coefficients (b1, b2) read out from said memory means.

10. A digital filter device according to claim 9, further comprising switch control means coupled to said digital filter means for switching and controlling the operation content of said digital filter means according to a switching signal for switching the filter modes of the digital filter means.

* * * * *

UNITED STATES PATENT AND TRADEMARK OFFICE
CERTIFICATE OF CORRECTION

PATENT NO. : 4,422,156
DATED : December 20, 1983
INVENTOR(S) : Shigenori SANO

It is certified that error appears in the above-identified patent and that said Letters Patent is hereby corrected as shown below:

COLUMN 14 (claim 4), line 63, change "said law pass" to --said low pass--;

COLUMN 15 (claim 7), line 27, change "filter means" to --filtering means--;

COLUMN 15 (claim 7), last line, change "filterimg means" to --filtering means--.

Signed and Sealed this

Thirty-first Day of July 1984

[SEAL]

Attest:

GERALD J. MOSSINGHOFF

Attesting Officer     Commissioner of Patents and Trademarks